US012599011B2

(12) United States Patent
Lin et al.

(10) Patent No.: US 12,599,011 B2
(45) Date of Patent: Apr. 7, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Yu-Hung Lin, Taichung City (TW); Wei-Ming Wang, Taichung City (TW); Su-Chun Yang, Hsinchu County (TW); Jih-Churng Twu, Hsinchu County (TW); Shih-Peng Tai, Xinpu Township, Hsinchu County (TW); Kuo-Chung Yee, Taoyuan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 523 days.

(21) Appl. No.: 18/166,122

(22) Filed: Feb. 8, 2023

(65) Prior Publication Data

US 2024/0128178 A1 Apr. 18, 2024

Related U.S. Application Data

(60) Provisional application No. 63/379,454, filed on Oct. 14, 2022.

(51) Int. Cl.
*H01L 21/762* (2006.01)
*H01L 23/29* (2006.01)
*H01L 23/498* (2006.01)

(52) U.S. Cl.
CPC .. *H01L 23/49827* (2013.01); *H01L 21/76224* (2013.01); *H01L 23/298* (2013.01)

(58) Field of Classification Search
None
See application file for complete search history.

(56) References Cited

U.S. PATENT DOCUMENTS

2013/0037935 A1* 2/2013 Xue .................... H01L 23/3114
257/737
2021/0305200 A1* 9/2021 Lin ...................... B23K 26/362

* cited by examiner

*Primary Examiner* — Jay C Chang
(74) *Attorney, Agent, or Firm* — McClure, Qualey & Rodack, LLP

(57) ABSTRACT

A method of forming a semiconductor structure is provided, and includes trimming a first substrate to form a recess on a sidewall of the first substrate. A conductive structure is formed in the first substrate. The method includes bonding the first substrate to a carrier. The method includes thinning down the first substrate. The method also includes forming a dielectric material in the recess and over a top surface of the thinned first substrate. The method further includes performing a planarization process to remove the dielectric material and expose the conductive structure over the top surface. In addition, the method includes removing the carrier from the first substrate.

20 Claims, 14 Drawing Sheets

SEMICONDUCTOR STRUCTURE AND METHOD FOR FORMING THE SAME

CROSS REFERENCE TO RELATED APPLICATIONS

This application claims the benefit of U.S. Provisional Application No. 63/379,454 filed Oct. 14, 2022, the entirety of which is incorporated by reference herein.

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
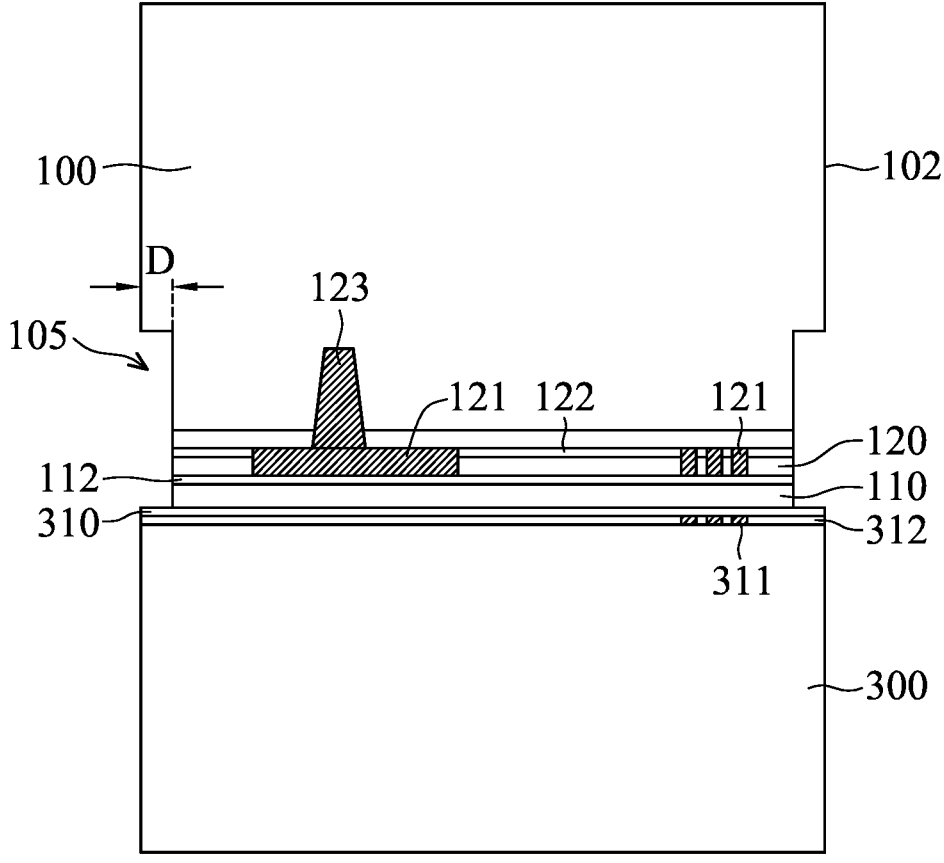
FIGS. 1A-1K are cross-sectional views illustrating various stages of forming a plurality of semiconductor dies in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and method for forming the same are provided. The semiconductor structure includes a dielectric material formed on a sidewall of the substrate. The dielectric material is configured to protect the substrate during the planarization process, so that the substrate may be less likely to be damaged on the sidewall, increasing the available area and yield of the substrate.

FIGS. 1A-1K are cross-sectional views illustrating various stages of forming a plurality of semiconductor dies 50 and 60 in accordance with some embodiments of the present disclosure. In some embodiments, the semiconductor dies 50 and 60 (for example, referring to FIG. 1K) are divided from one or more substrate, which may include different device regions that are singulated in subsequent steps to form the plurality of semiconductor dies 50 and 60. In some embodiments, the semiconductor dies 50 and 60 are processed according to applicable manufacturing processes to form integrated circuits. For example, a first substrate 100 includes a semiconductor substrate, including such as silicon, doped or undoped, or an active layer of a semiconductor-on-insulator (SOI) substrate. In some embodiments, the first substrate 100 includes other semiconductor materials, such as germanium; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; or a combination thereof. Other substrates, such as multi-layered or gradient substrates, may also be used. In some embodiments, the first substrate 100 has a device surface (e.g., the surface facing the carrier 300 in FIG. 1A), sometimes called a front side, and a bonding surface (e.g., the surface facing upwards in FIG. 1A), sometimes called a back side.

In some embodiments, a conductive structure 120 is formed on the front side of the first substrate 100. In some embodiments, the conductive structure 120 includes metallization patterns 121, a dielectric layer 122, and a through-silicon via (TSV) 123. The metallization patterns 121 and the through-silicon via 123 are surrounded by the dielectric layer 122 for proper insulation, reducing the probability of forming short-circuit. In some embodiments, one or more devices (not individually shown) are electrically connected to the conductive layer 121 and/or the through-silicon via 123 in the first substrate 100. In some embodiments, the devices are active devices (e.g., transistors, diodes, etc.), capacitors, resistors, etc. For example, the devices in the conductive structure 120 are metal-oxide-semiconductor field-effect transistor (MOSFET), in accordance with some embodiments of the present disclosure. The dielectric layer 122 surrounds and covers the devices.

In some embodiments, the dielectric layer 122 includes one or more sub-dielectric layers formed of materials such as silicon dioxide ($SiO_2$), Phospho-Silicate Glass (PSG), Boro-Silicate Glass (BSG), Boron-Doped Phospho-Silicate Glass (BPSG), undoped Silicate Glass (USG), or the like. In some embodiments, the dielectric layer 122 is formed, for example, by spin coating, lamination, chemical vapor deposition (CVD), or the like. In some embodiments, the metallization patterns 121 include metal lines and vias formed in one or more dielectric layer 122. For example, the metallization patterns 121 include conductive material such as tungsten (W), cobalt (Co), nickel (Ni), copper (Cu), silver (Ag), gold (Au), aluminum (Al), any other suitable conductive material, or a combination thereof.

In some embodiments, the through-silicon via 123 extends through the first substrate 100 and the dielectric layer 122 to electrically and physically couple the metallization patterns 121. In some embodiments, the through-silicon via 123 is electrically connected to the metallization patterns 121 of the conductive structure 120 for forming a conductive path connected to external environment (e.g. another semiconductor die or external devices). For example, when the devices in the conductive structure 120 are transistors, the through-silicon via 123 may couple the gates or source/drain regions of the transistors. Source/drain regions may refer to a source or a drain, individually or collectively dependent upon the context. In some embodiments, the through-silicon via 123 is formed of tungsten (W), cobalt (Co), nickel (Ni), copper (Cu), silver (Ag), gold (Au), aluminum (Al), any other suitable conductive material, or a combination thereof. However, the present disclosure is not limited thereto. In some embodiments, the metallization patterns 121 and the through-silicon via 123 are formed of the same material. In some other embodiments, the metallization patterns 121 and the through-silicon via 123 are formed of different materials. In some embodiments, the through-silicon via 123 has a tapered profile in the cross-sectional view. However, the present disclosure is not limited thereto. In some other embodiments, the through-silicon via 123 may have a rectangular profile in the cross-sectional view.

As shown in FIG. 1A, the first substrate 100 is bonded to the carrier 300. For example, a bonding film 110 is formed on the conductive structure 120 for the bonding process. For example, the material of the bonding film 110 includes SiON, $SiO_2$, any other suitable material, or a combination thereof. In addition, another bonding film 310 is formed on the carrier 310 for the bonding process. For example, the material of the bonding film 310 includes SiON, $SiO_2$, any other suitable material, or a combination thereof. In some embodiments, the material of the bonding film 110 is the same as the material of the bonding film 310. Although two bonding films (e.g. the bonding film 110 and the bonding film 310) are shown in the present disclosure, it should be appreciated that one or multiple (more than two) bonding films are also adopted in the present disclosure. In some embodiments, a dielectric layer 112 is formed and sandwiched between the bonding film 110 and the conductive structure 120.

In some embodiments, a dielectric layer 312 may be formed and sandwiched between the bonding film 310 and the carrier 300, and metallization patterns 311 may be formed in the dielectric layer 312 for alignment purpose. For example, the dielectric layer 312 is provided for the formation of the bonding film 310. For example, the metallization patterns 311 are aligned with the metallization patterns 121 in a vertical direction (such as a direction that is substantially parallel to the Z-axis). Accordingly, the accuracy for bonding the first substrate 100 to the carrier 300 may be enhanced.

In some embodiments, the first substrate 100 is trimmed to form a recess 105 on a sidewall 102 of the first substrate 100. For example, the recess 105 has a depth D from about 0.5 mm to about 5 mm, and the depth D is measured from the untrimmed sidewall 102 to the bottom of the recess 105 along a direction that is substantially parallel to the X-axis, for example. In some embodiments, the trimming process performed to the first substrate 100 removes a portion of the conductive structure 120 and/or a portion of the bonding film 110. In some embodiments, the trimming process performed to the first substrate 100 recesses the whole sidewall 102 of the first substrate 100, and the depth D may be measured from the sidewall of the carrier 300 to the bottom of the recess 105 along the direction that is substantially parallel to the X-axis, for example. In some embodiments, the trimming process is performed after the first substrate 100 is bonded to the carrier 300. However, the present disclosure is not limited thereto. In some other embodiments, the trimming process is performed prior to bonding the first substrate 100 to the carrier 300.

Figure 1B:
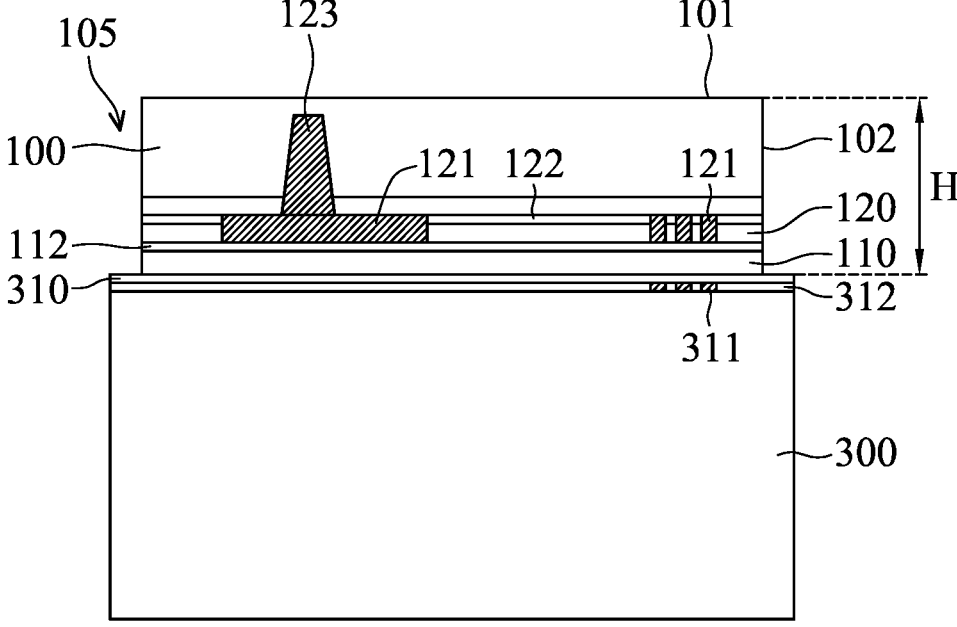
Figure 1B:
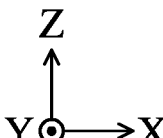

Next, as shown in FIG. 1B, the first substrate 100 is thinned down to a height H from about 2 μm to about 100 μm, and the height H is measured from the top surface 101 of the first substrate 100 to the carrier 300 (for example, the top surface of the bonding film 310) in a direction that is substantially parallel to the Z-axis. It should be noted that the top surface 101 of the first substrate 100 is a relative directional term referring to the surface of the first substrate 100 that is facing away from the carrier 300, and the top surface 101 may be located at a lower position (for example, viewed as the bottom surface) if the first substrate 100 is flipped upside-down. In some embodiments, the first substrate 100 is thinned down using a polishing process, a grinding process, any other suitable process, or a combination thereof.

Figure 1C:
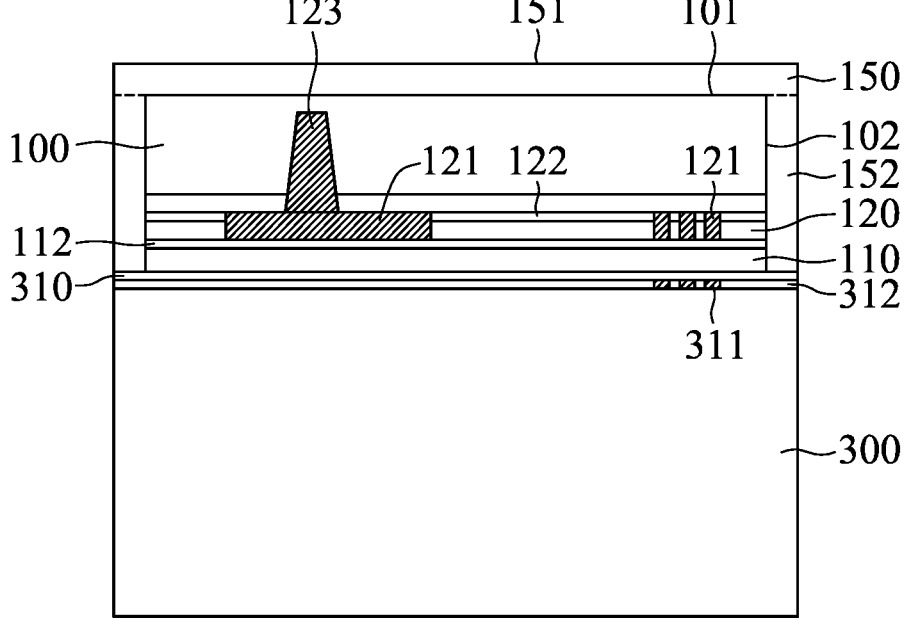
Figure 1C:
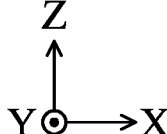

Then, as shown in FIG. 1C, a dielectric material 150 is formed on the recessed sidewall 102 and over the top surface 101 of the first substrate 100. Accordingly, the dielectric material 150 fills the recess 105. In some embodiments, the dielectric material 150 is formed by a spin-on coating process. As such, the dielectric material 150 may be conformally formed on the sidewall 102, reducing the probability of forming voids between the sidewall 102 and the dielectric material 150.

In some embodiments, the dielectric material 150 is a silicon-oxygen-carbon based compound. For example, the dielectric material 150 includes silicon (Si), oxygen (O), carbon (C), any other suitable element, or a combination thereof. In some embodiments, a silicon concentration of the dielectric material 150 is from about 5 weight percent (wt %) to about 30 weight percent. In some embodiments, an oxygen concentration of the dielectric material 150 is from about 5 weight percent to about 60 weight percent. In some embodiments, a carbon concentration of the dielectric material 150 is from about 5 weight percent to about 90 weight percent. In some embodiments, the dielectric material 150 is consist of silicon, oxygen, and carbon, and therefore the overall concentration of silicon, oxygen, and carbon in the dielectric material 150 is substantially 100%.

In some embodiments, the dielectric material 150 includes a first portion 151 over the top surface 101 of the first substrate 100 and a second portion 152 on the sidewall 102 of the first substrate 100. In some embodiments, the top surface of the second portion 152 is substantially level with the bottom surface of the first portion 151, which is further level with the top surface 101 of the first substrate 100. As shown in FIG. 1C, the first portion 151 and the second portion 152 are defined and separated by the dotted lines.

Figure 1D:
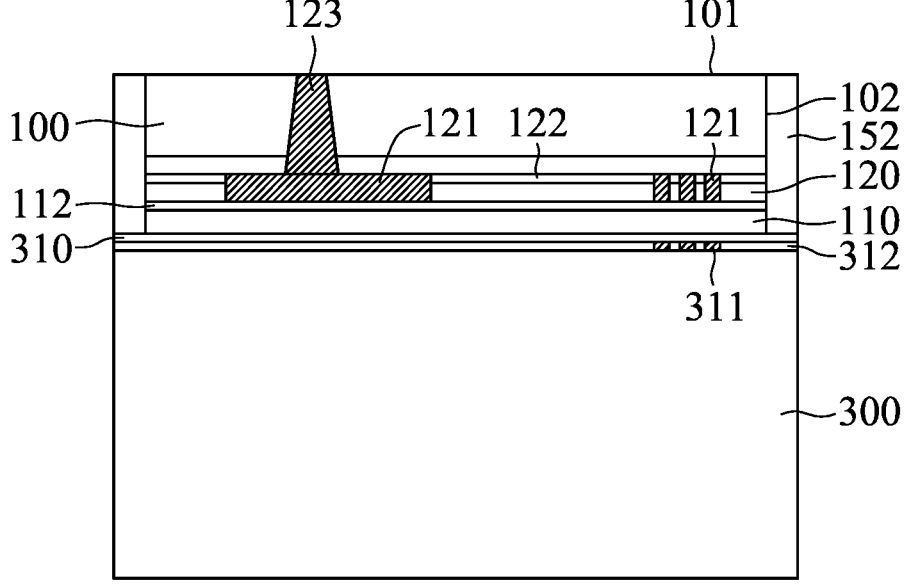
Figure 1D:
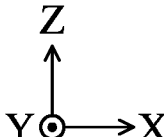

Next, as shown in FIG. 1D, the first portion 151 of the dielectric material 150 is removed, leaving the second portion 152 of the dielectric material 150. For the simplicity of description, the remaining second portion 152 of the dielectric material 150 may be referred to as the dielectric material 152 in the following paragraphs. In some embodiments, the first portion 151 may be removed by a polishing process or any other suitable process, for example, a chemical mechanical polish (CMP) process.

The first substrate 100 may be thinned down until the through-silicon via 123 is exposed from the top surface 101 of the first substrate 100. Therefore, the conductive structure 120 may be electrically connected to the external environment (e.g. another semiconductor die or external devices) via the through-silicon via 123. Since the dielectric material 152 is formed, the first substrate 100 may be less likely to be damaged on the sidewall 102, increasing the available area and yield of the first substrate 100.

Figure 1E:
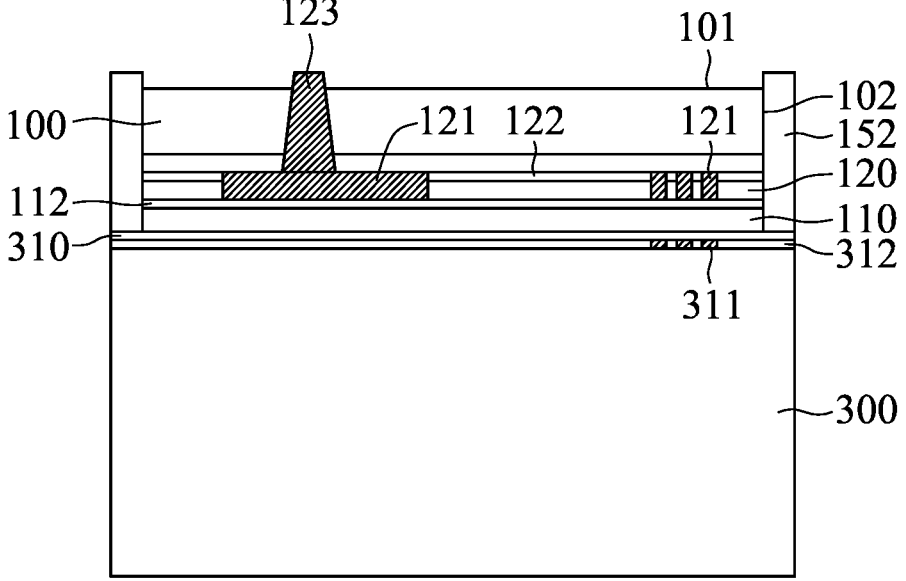
Figure 1E:
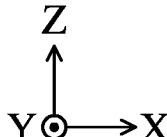

Then, as shown in FIG. 1E, the first substrate 100 is recessed from the top surface 101, and the through-silicon via 123 and the dielectric material 152 are retained. In some embodiments, an etching process is performed to the top surface 101 of the first substrate 100 after the first portion 151 of the dielectric material 150 is removed, and the etching process selectively recesses the first substrate 100 and retains the dielectric material 152.

In some embodiments, a patterned photoresist layer (not shown) is formed over the dielectric material 152. The patterned photoresist layer may be formed by a deposition process and a patterning process. The deposition process for forming the patterned photoresist layer may include a chemical vapor deposition (CVD) process, a high-density plasma chemical vapor deposition (HDPCVD) process, a spin-on process, a sputtering process, or another applicable process. The patterning process for forming the patterned photoresist layer may include a photolithography process and an etching process. The photolithography process may include photoresist coating (e.g., spin-on coating), soft baking, mask aligning, exposure, post-exposure baking, developing the photoresist, rinsing, and drying (e.g., hard baking). The etching process may include a dry etching process or a wet etching process. Then, as shown in FIG. 1E, the first substrate 100 may be recessed by performing an etching process, using the patterned photoresist layer as a mask. The etching process may be a dry etching process or a wet etching process. In some embodiments, the dry etching process includes using a fluorine-based etchant gas, such as $SF_6$, $C_xF_y$, $NF_3$ or a combination thereof. The etching process may be a time-controlled process. Afterwards, the patterned photoresist layer is removed.

Figure 1F:
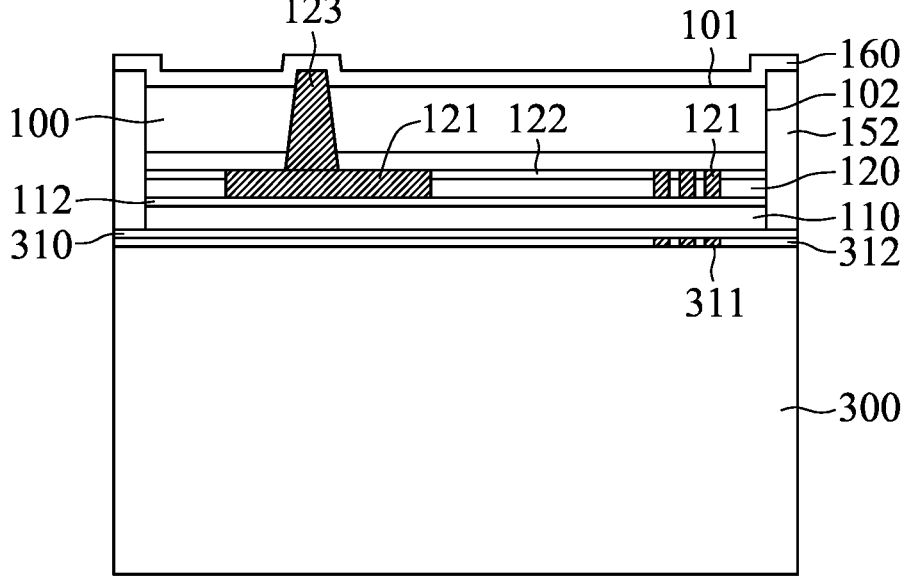
Figure 1F:
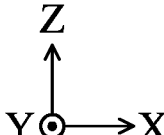

Then, as shown in FIG. 1F, a passivation layer 160 is formed over the first substrate 100 and the dielectric material 152. In some embodiments, the passivation layer 160 is formed, for example, by spin coating, lamination, chemical vapor deposition (CVD), or any other applicable method. For example, the passivation layer 160 includes passivation material such as SiN, USG, $SiO_2$, any suitable material, or a combination thereof. In some embodiment, the passivation layer 160 is conformally formed and covers the top surfaces of the first substrate 100 and the dielectric material 152. Although the first substrate 100 is recessed, the top surface of the passivation layer 160 is still higher than the top surface of the dielectric material 152. It should be noted that although single passivation layer 160 is shown in FIG. 1F, but the passivation layer 160 may also be a multi-layered structure.

Figure 1G:
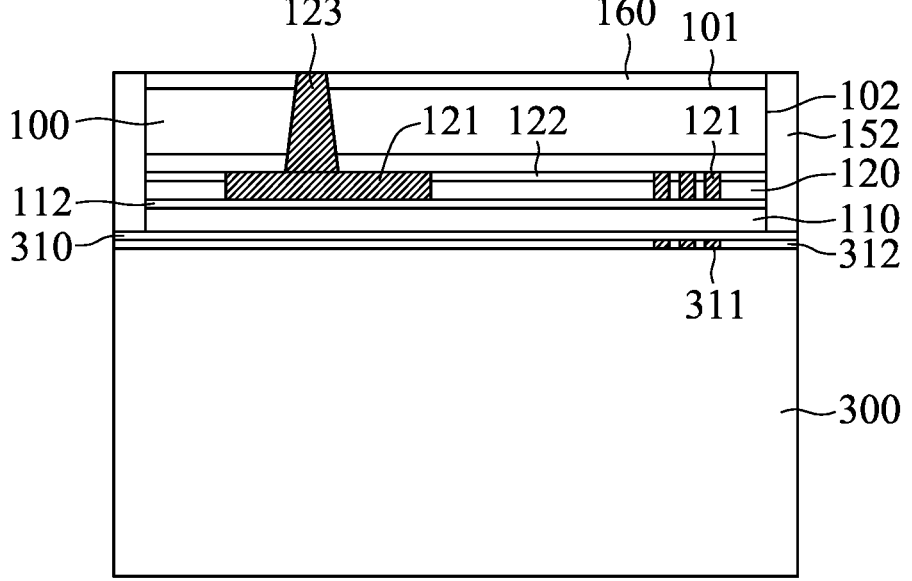
Figure 1G:
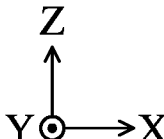

Then, as shown in FIG. 1G, a planarization process is performed for leveling the top surface of the passivation layer 160 and the top surface of the dielectric material 152. Accordingly, the portion of the passivation layer 160 over the dielectric material 152 is removed. In some embodiments, the planarization process may be a polishing process or any other suitable process, for example, a chemical mechanical polish (CMP) process. The passivation layer 160 may be thinned down until the through-silicon via 123 is exposed from the passivation layer 160.

Figure 1H:
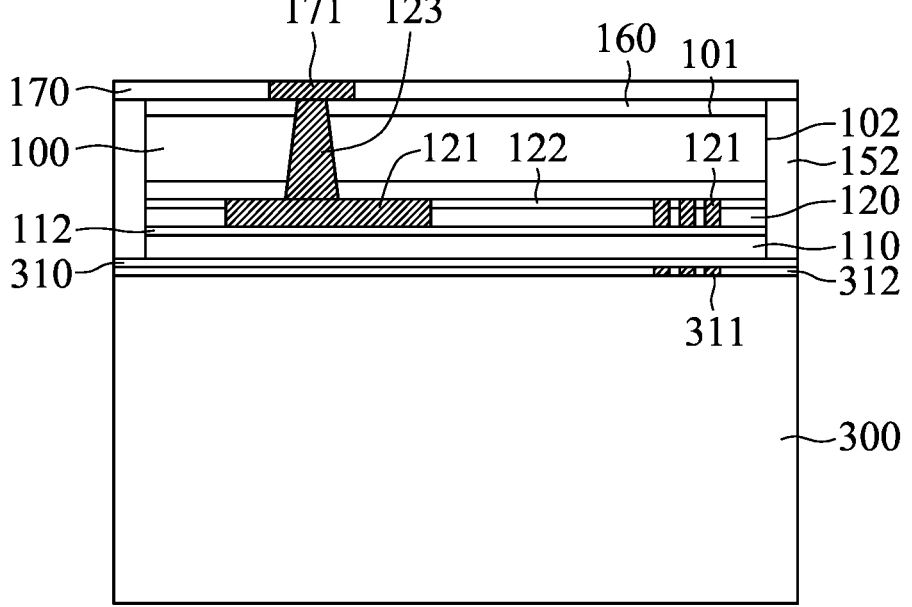
Figure 1H:
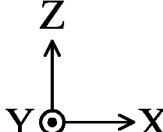

Then, as shown in FIG. 1H, a bonding film 170 is formed over the top surfaces of the passivation layer 160 and the dielectric material 152 for the subsequent bonding process. For example, the material of the bonding film 170 includes SiON, $SiO_2$, any other suitable material, or a combination thereof. In some embodiments, the material of the bonding film 170 is the same as the material of the bonding film 110. In some embodiments, a conductive pad 171 is formed in the bonding film 170 and electrically connected to the through-silicon via 123. The conductive pad 171 may be disposed directly above the through-silicon via 123. For example, the conductive pad 171 includes conductive material such as tungsten (W), cobalt (Co), nickel (Ni), copper (Cu), silver (Ag), gold (Au), aluminum (Al), any other suitable conductive material, or a combination thereof.

Figure 1I:
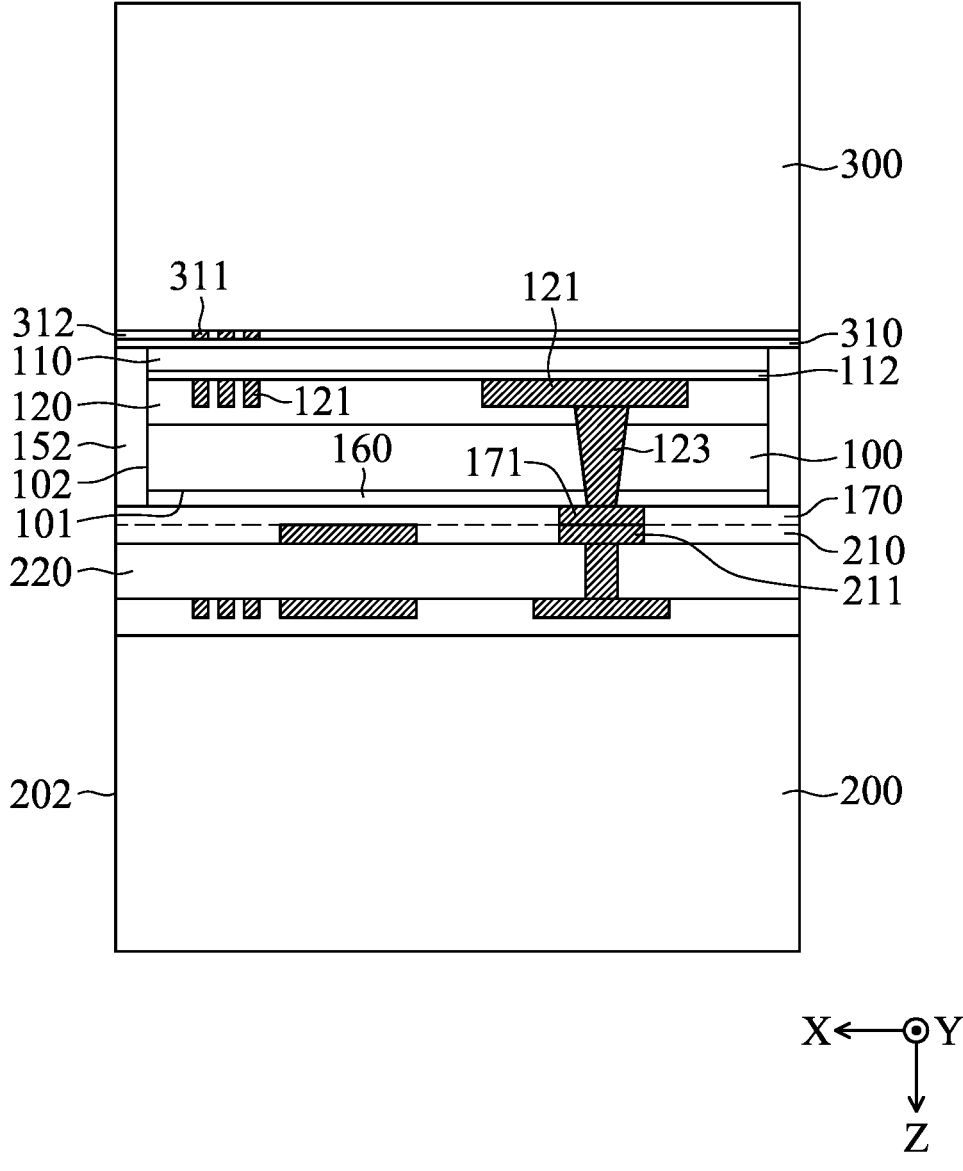

Then, as shown in FIG. 1I, a second substrate 200 is bonded to the first substrate 100 via the bonding film 170. In some embodiments, the first substrate 100 and the carrier 300 are flipped for bonding the second substrate 200. However, the present disclosure is not limited thereto. In some other embodiments, the second substrate 200 may be bonded to the first substrate 100 without flipping. For example, the second substrate 200 includes a semiconductor substrate, including such as silicon, doped or undoped, or an active layer of a semiconductor-on-insulator (SOI) substrate. In some embodiments, the second substrate 200 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used. For example, the second substrate 200 includes a conductive structure 220 and a bonding film 210 over the conductive structure 220. The conductive structure 220 may include the same or similar structure as the conductive structure 120, and will not be discussed in detail below. It should be noted that the illustrated configurations of the conductive structures 120 and 220 are merely examples, and the present disclosure is not limited thereto.

For example, the material of the bonding film 210 includes SiON, $SiO_2$, any other suitable material, or a combination thereof. In some embodiments, the material of the bonding film 210 is the same as the material of the bonding film 110. In some embodiments, a conductive pad 211 is formed in the bonding film 210 and electrically connected to the conductive pad 171. The conductive pad 171 may be disposed directly above the conductive pad 211. For example, the conductive pad 211 includes conductive material such as tungsten (W), cobalt (Co), nickel (Ni), copper (Cu), silver (Ag), gold (Au), aluminum (Al), any other suitable conductive material, or a combination thereof. In some embodiments, the size of the conductive pad 171 is substantially the same as the size of the conductive pad 211 for alignment purpose. However, the present disclosure is not limited thereto.

In some embodiments, the dielectric material 152 is formed on the sidewall 102 of the first substrate 100, but the sidewall 202 of the second substrate 200 is free from the dielectric material 152. However, the present disclosure is not limited thereto. In some other embodiments, the dielectric material 152 is formed on the sidewall 102 of the first substrate 100 and the sidewall 202 of the second substrate 200. It should be noted that bonding the second substrate 200 is an optional step, and in some other embodiments, the first substrate 100 may be diced to form a plurality of semiconductor dies itself.

Figure 1J:
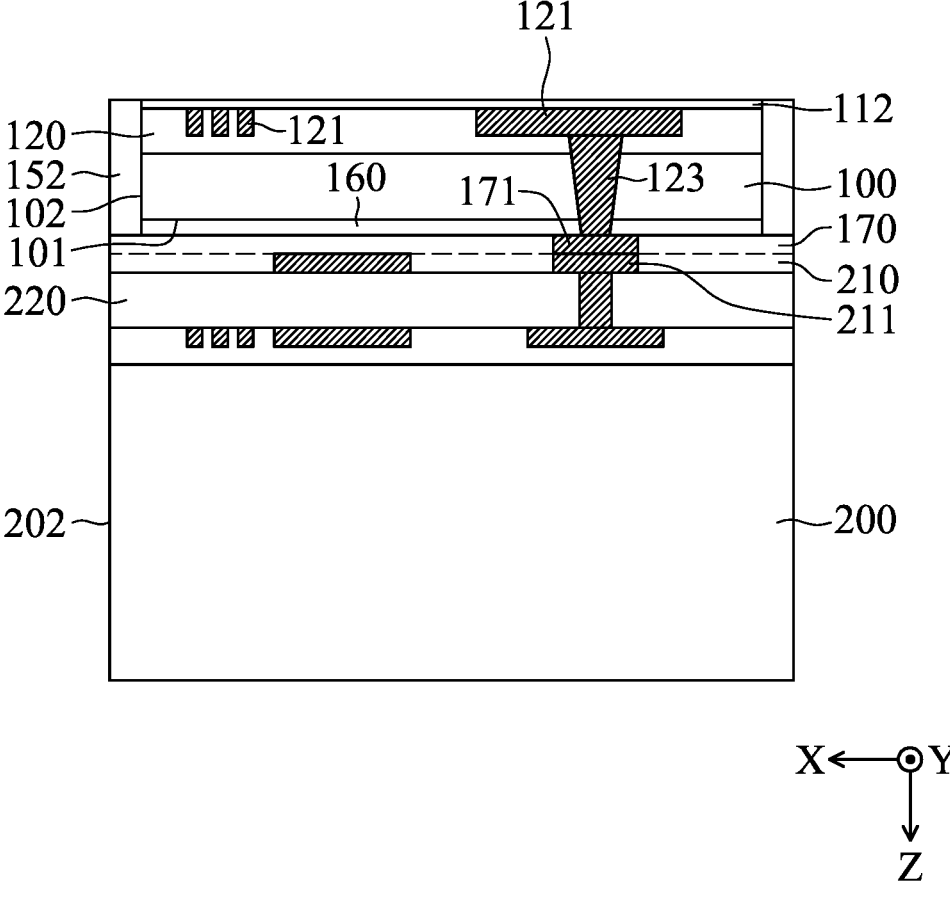

Then, as shown in FIG. 1J, the carrier 300 is removed from the first substrate 100 and the second substrate 200. In some embodiments, the bonding film 110 of the first substrate 100 is also removed during the removal of the carrier 300. In some embodiments, the top surface of the dielectric material 152 is substantially level with the top surface of the exposed dielectric layer 112.

Figure 1K:
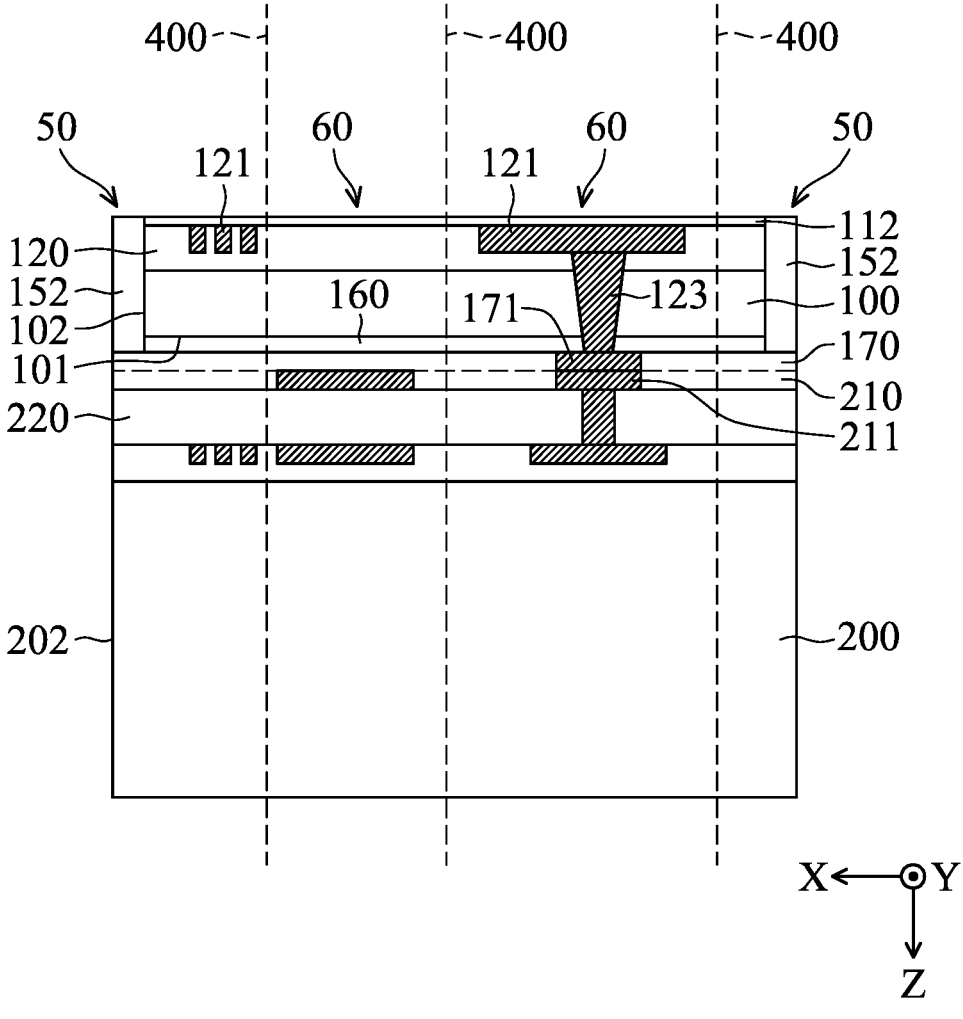

Then, as shown in FIG. 1K, a dicing process is performed to divide the first substrate 100 and the second substrate 200 to form a plurality of semiconductor dies 50 and 60. For example, the first substrate 100 and the second substrate 200 are cut along a plurality of scribe lines 400 to form a plurality of semiconductor dies 50 and 60. In some embodiments, the semiconductor dies 50 are formed at the edge of the first substrate 100 and the second substrate 200, and therefore referred to as the edge dies 50 in the following paragraphs. In addition, the semiconductor dies 60 are formed at the central region of the first substrate 100 and the second substrate 200, and therefore referred to as the central dies 60 below. The difference between the edge dies 50 and the central dies 60 is that the edge dies 50 includes the dielectric material 152 on one sidewall of the edge dies 50, and the central dies 60 does not include the dielectric material 152. As shown in FIG. 1K, the dielectric material 152 in the edge die 50 laterally covers the passivation layer 160 and laterally exposes the bonding film 170. Accordingly, when the edge die 50 is packaged to form a semiconductor package (such as the semiconductor package 500 shown in FIG. 2), the dielectric material 152 is sandwiched between the passivation layer 160 and the package layer (for example, the package layer 540 shown in FIG. 2), and the bonding film 170 is in contact with the above package layer.

In some embodiments, the edge dies 50 and the central dies 60 are stacked devices that include multiple substrates (for example, the first substrate 100 and the second substrate 200). For example, the edge dies 50 and the central dies 60 may be a memory device such as a hybrid memory cube (HMC) module, a high bandwidth memory (HBM) module, or the like that includes multiple memory dies. In such embodiments, the edge dies 50 and the central dies 60 include multiple substrates interconnected by through-substrate vias (TSVs), for example, the through-substrate via 123 discussed above. Each of the substrates may (or may not) have a conductive structure.

Optionally, solder regions (e.g., solder balls or solder bumps) may be disposed on and electrically connected to the conductive structure. In some embodiments, some solder balls are used to perform chip probe (CP) testing on the edge dies 50 and the central dies 60. In some embodiments, CP testing is performed on the edge dies 50 and the central dies 60 to ascertain whether the edge dies 50 and the central dies 60 are known good dies (KGDs). In some embodiments, only edge dies 50 and central dies 60, which are KGDs, undergo subsequent processing and are packaged, and dies, which fail the CP testing, are not packaged. After testing, the solder regions may be removed in subsequent processing steps.

Figure 2:
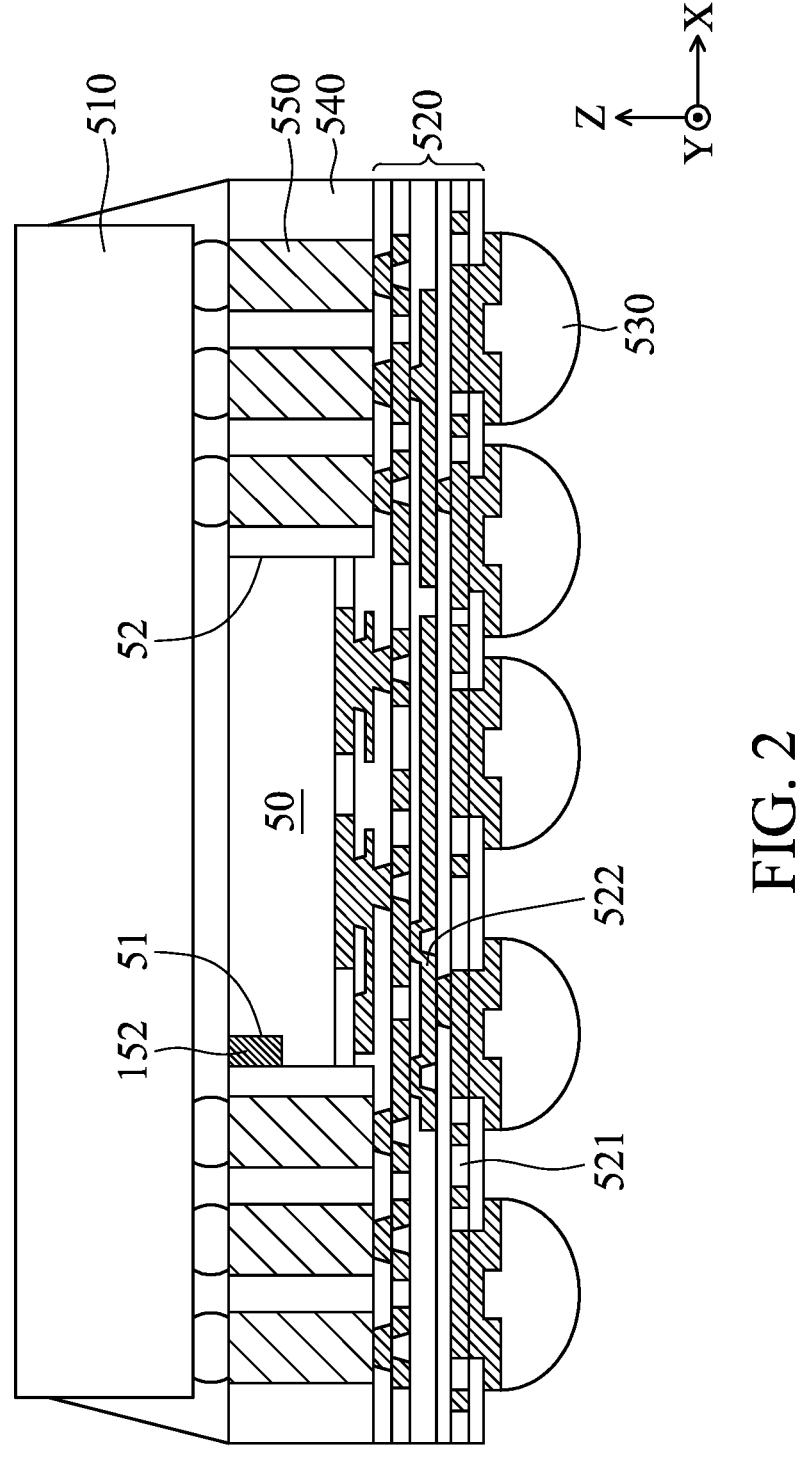
FIG. 2 is a cross-sectional view illustrating a semiconductor package in accordance with some embodiments of the present disclosure.

FIG. 2 is a cross-sectional view illustrating a semiconductor package 500 in accordance with some embodiments of the present disclosure. Additional features may be added to the semiconductor package 500, and some of the features described below can be replaced, modified, or eliminated in other embodiments of the semiconductor package 500. The edge dies 50 and/or the central dies 60 are simplified in FIG. 2 for the sake of clarity.

In addition to the edge die 50, the semiconductor package 500 includes a semiconductor die 510, a package substrate 520, a plurality of conductive connectors 530, a package layer 540, and a plurality of through integrated fan-out (InFO) vias (TIV) 550. The term "fan-out" means that the I/O pads on the edge die 50 can be redistributed to a greater area than the edge die 50 itself, and thus the number of I/O pads packed on the surfaces of the semiconductor package 10 can be increased.

The semiconductor die 510 may be a logic die, a memory die, a passive device die, an analog die, a MEMS die, a radio frequency RF die, and a combination thereof. For example, a logic die may be a central processing unit die, a system on a chip (SoC) die, a system on integrated chip (SOIC) die, a microcontroller die, and the like. A memory die may be a dynamic random access memory (DRAM) die, a static random access memory (SRAM) die, a HBM die, a NAND die, and the like.

For example, the package substrate 520 includes doped or undoped silicon, or may be a semiconductor-on-insulator (SOI) substrate. In some embodiments, the package substrate 520 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used. It is appreciated that the edge die 50 are, for example, made by the previous discussed processed. However, any other semiconductor die may also be packaged in the present process.

The package substrate 520 may be a fan-out redistribution layer and include a plurality of dielectric layers 521 and a plurality of conductive layers 522. The conductive connectors 530 are formed over the conductive layers 522 that are exposed from the dielectric layers 521. In some embodiments, the conductive connectors 530 include controlled collapse chip connection (C4) bumps, solder bumps, copper bumps, micro bumps, electroless nickel-electroless palladium-immersion gold technique (ENEPIG) formed bumps, ball grid array (BGA) bumps, copper pillars, and the like.

In some embodiments, the package layer 540 is formed to surround the edge die 50. The dielectric material 152 is formed on a first sidewall 51 of the edge die 50. Accordingly, the dielectric material 152 is sandwiched between the package layer 540 and the first sidewall 51 of the edge die 50, and the package layer 540 contacts a second sidewall 52 of the edge die 50, and the second sidewall 52 is opposite the first sidewall 51.

For example, the package layer 540 is made of or includes a polymer material. The package layer 540 may include an epoxy-based resin. In some embodiments, the package layer

540 includes fillers dispersed in the epoxy-based resin. In some embodiments, the formation of the package layer 540 involves an injecting process, a spin-on process, a dispensing process, a film lamination process, an application process, one or more other applicable processes, or a combination thereof. In some embodiments, a thermal curing process is used during the formation of the package layer 540. The TIVs 550 penetrate the package layer 540 to provide electrical connection.

Figure 3:
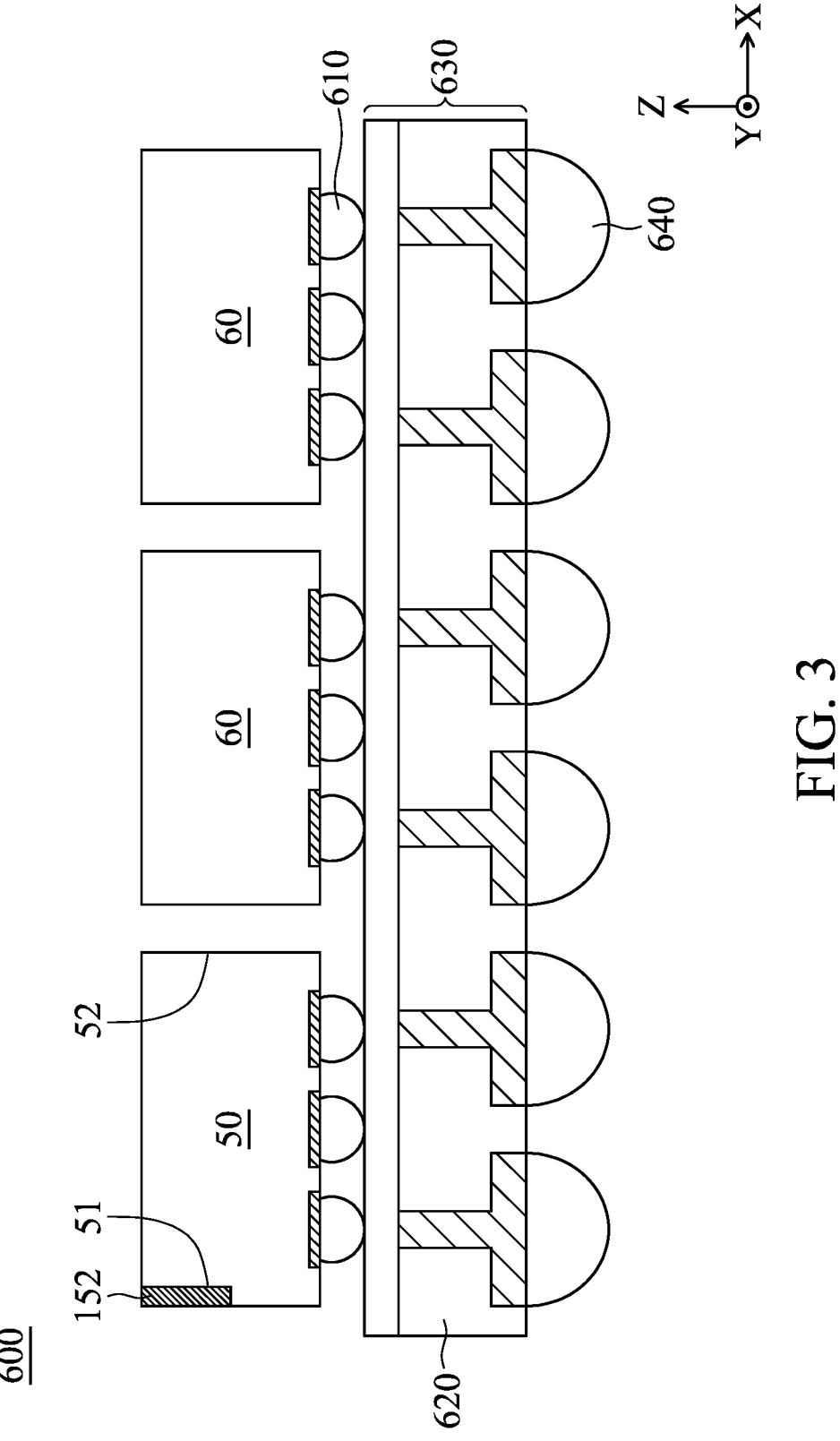
FIG. 3 is a cross-sectional view illustrating a semiconductor package in accordance with some embodiments of the present disclosure.

FIG. 3 is a cross-sectional view illustrating a semiconductor package 600 in accordance with some embodiments of the present disclosure. Additional features may be added to the semiconductor package 600, and some of the features described below can be replaced, modified, or eliminated in other embodiments of the semiconductor package 600. The edge dies 50 and/or the central dies 60 are simplified in FIG. 3 for the sake of clarity.

In addition to the edge dies 50 and the central dies 60, the semiconductor package 600 includes a plurality of contact pads 610, a package substrate 620, a redistribution structure 630, and a plurality of conductive connectors 640. The contact pads 610 are formed under the edge dies 50 and the central dies 60 to provide electrical connection. The package substrate 620 may be an interposer and fabricated from a silicon material, an organic (laminate) material, a polymer-based material, and the like. The package substrate 620 may be attached to a carrier such as a printed circuit board (PCB). The redistribution structure 630 may include metal lines and vias to provide electrical connection to route power, ground, and signals from the top surface of the package substrate 620 to the bottom surface of the package substrate 620. In some embodiments, the conductive connectors 640 are C4 bumps, solder bumps, copper bumps, micro bumps, ENEPIG formed bumps, BGA bumps, copper pillars, and the like.

In some embodiments, both the edge dies 50 and the central dies 60 are packaged to form the semiconductor package 600. For example, one edge die 50 and two central dies 60 are disposed over the package substrate 620, in accordance with the embodiment shown in FIG. 3. The edge die 50 is disposed at an edge of the package substrate 620, and the dielectric material 152 is away from the central dies 60. However, the present disclosure is not limited thereto. In some other embodiments, the semiconductor dies disposed over the package substrate 620 are all edge die 50 or all central dies 60. Those skilled in the art should realize how to adjust the number and orientation of the edge die 50 and/or the central dies 60 based on the present disclosure.

Figure 4:
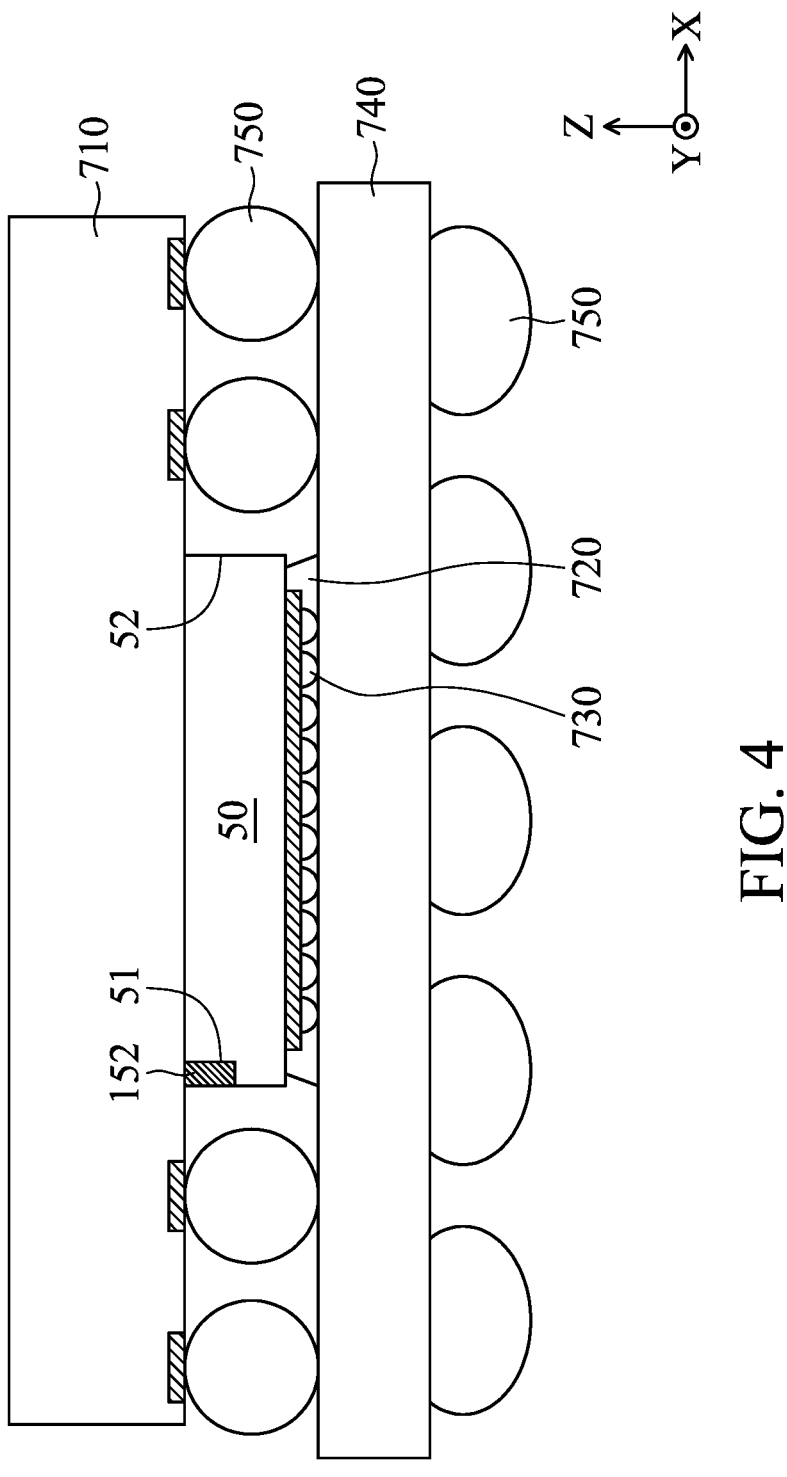
FIG. 4 is a cross-sectional view illustrating a semiconductor package in accordance with some embodiments of the present disclosure.

FIG. 4 is a cross-sectional view illustrating a semiconductor package 700 in accordance with some embodiments of the present disclosure. Additional features may be added to the semiconductor package 700, and some of the features described below can be replaced, modified, or eliminated in other embodiments of the semiconductor package 700. The edge dies 50 and/or the central dies 60 are simplified in FIG. 4 for the sake of clarity.

In addition to the edge die 50, the semiconductor package 700 includes a semiconductor die 710, a package layer 720, a plurality of contact pads 730, a package substrate 740, and a plurality of conductive connectors 750.

The semiconductor die 710 may be a logic die, a memory die, a passive device die, an analog die, a MEMS die, a radio frequency RF die, and a combination thereof. For example, a logic die may be a central processing unit die, a SoC die, a SOIC die, a microcontroller die, and the like. A memory die may be a DRAM die, a SRAM die, a HBM die, a NAND die, and the like. The contact pads 730 are formed within the package layer 720 to provide electrical connection. In some embodiments, the conductive connectors 750 are C4 bumps, solder bumps, copper bumps, micro bumps, ENEPIG formed bumps, BGA bumps, copper pillars, and the like. In some embodiments, the edge die 50 may be connected to the package substrate 740 by flip-chip bonding technology.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs. These configurations of the semiconductor dies serve as examples, and based on the present disclosure, those skilled in the art would adopt one or more configurations as required. It should be appreciated that the semiconductor packages 500, 600, and 700 may include other structures or components that are not illustrated in the present embodiment, as long as the structures or components do not depart from the scope of the present disclosure.

As described above, the present disclosure is directed to semiconductor structures and methods for forming the same. The method includes forming a dielectric material on a recessed sidewall of the substrate. The dielectric material is configured to protect the substrate during the planarization process, so that the substrate may be less likely to be damaged on the sidewall, increasing the available area and yield of the substrate.

In accordance with some embodiments, a method of forming a semiconductor structure includes trimming a first substrate to form a recess on the sidewall of the first substrate, and a conductive structure is formed in the first substrate. The method includes bonding the first substrate to a carrier. The method includes thinning down the first substrate. The method includes forming a dielectric material in the recess and over the top surface of the thinned first substrate. The method includes performing a planarization process to remove the dielectric material and expose the conductive structure over the top surface. The method includes removing the carrier from the first substrate.

In accordance with some embodiments, a method of forming a semiconductor structure includes trimming the sidewall of the first substrate. The method includes bonding the first substrate to a carrier. The method includes forming a dielectric material, and the dielectric material includes a first portion on the top surface of the first substrate and a second portion on the sidewall of the first substrate. The method includes removing the first portion of the dielectric material. The method includes removing the carrier from the first substrate. The method includes dividing the first substrate to form a plurality of edge dies, and each of the edge dies includes the dielectric material on the sidewall of the edge dies.

In accordance with some embodiments, a semiconductor structure includes a package substrate and an edge die disposed over the package substrate. The edge die includes a dielectric material on the first sidewall of the edge die, and the dielectric material includes silicon, carbon, and oxygen. The semiconductor structure also includes a package layer formed around the edge die. The dielectric material is sandwiched between the package layer and the first sidewall of the edge die, the package layer contacts the second sidewall of the edge die, and the second sidewall is opposite the first sidewall. The semiconductor structure further includes a plurality of conductive connectors connected to the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   trimming a first substrate to form a recess on a sidewall of the first substrate, wherein a conductive structure is formed in the first substrate;
   bonding the first substrate to a carrier;
   thinning down the first substrate;
   forming a dielectric material in the recess and over a top surface of the thinned first substrate;
   performing a planarization process to remove the dielectric material and expose the conductive structure over the top surface; and
   removing the carrier from the first substrate.

2. The method as claimed in claim 1, wherein trimming the first substrate comprises forming the recess having a depth from 0.5 mm to 5 mm.

3. The method as claimed in claim 1, further comprising:
   recessing the first substrate between the dielectric material in the recess.

4. The method as claimed in claim 3, further comprising:
   forming a passivation layer over the first substrate and the dielectric material; and
   performing a planarization process to remove the passivation layer over a top surface of the dielectric material.

5. The method as claimed in claim 4, further comprising:
   forming a bonding film over the passivation layer and the dielectric material.

6. The method as claimed in claim 1, further comprising bonding a second substrate to the first substrate on the carrier.

7. A method of forming a semiconductor structure, comprising:
   trimming a sidewall of a first substrate;
   bonding the first substrate to a carrier;
   forming a dielectric material, wherein the dielectric material comprises a first portion on a top surface of the first substrate and a second portion on the sidewall of the first substrate;
   removing the first portion of the dielectric material;
   removing the carrier from the first substrate; and
   dividing the first substrate to form a plurality of edge dies, wherein each of the edge dies comprises the dielectric material on a sidewall of the edge dies.

8. The method as claimed in claim 7, further comprising:
   performing an etching process on the top surface of the first substrate after the first portion of the dielectric material is removed, wherein the etching process selectively recesses the first substrate and retains the dielectric material.

9. The method as claimed in claim 8, wherein the etching process exposes a portion of a conductive structure in the first substrate.

10. The method as claimed in claim 8, further comprising:
   forming a passivation layer over the recessed first substrate and the dielectric material, wherein a top surface of the passivation layer is higher than a top surface of the dielectric material.

11. The method as claimed in claim 10, further comprising performing a planarization process for leveling the top surface of the passivation layer and the top surface of the dielectric material.

12. The method as claimed in claim 11, further comprising:
   forming a bonding film over the top surfaces of the passivation layer and the dielectric material of the first substrate; and
   bonding a second substrate via the bonding film to the first substrate on the carrier.

13. The method as claimed in claim 12, wherein the second substrate and the first substrate are bonded via a bonding pad in the bonding film.

14. The method as claimed in claim 7, further comprising:
   dividing the first substrate to form a plurality of central dies, wherein the central dies are free from the dielectric material on a sidewall of the central dies; and
   bonding either one of the edge dies or one of the central dies to a package substrate.

15. A method of forming a semiconductor structure, comprising:
   bonding a trimmed substrate to a carrier, wherein the trimmed substrate has a recess on a sidewall of the trimmed substrate;
   removing a portion of the trimmed substrate over the recess;
   forming a dielectric material around the trimmed substrate;
   etching the trimmed substrate to expose a through-silicon via in the trimmed substrate;
   forming a passivation layer over the trimmed substrate and the dielectric material;
   performing a planarization process to level a top surface of the passivation layer and a top surface of the dielectric material;
   forming a first conductive pad over the through-silicon via;
   bonding the trimmed substrate to a base substrate; and
   dicing the trimmed substrate and the base substrate to form a semiconductor die.

16. The method as claimed in claim 15, wherein
   forming a bonding film over the top surface of the passivation layer and the top surface of the dielectric material.

17. The method as claimed in claim 16, further comprising:
   forming a second conductive pad in the bonding film, wherein the first conductive pad and the second conductive pad are located on opposite sides of the through-silicon via.

18. The method as claimed in claim 15, wherein a silicon concentration of the dielectric material is from 5 weight percent to 30 weight percent, and an oxygen concentration of the dielectric material is from 5 weight percent to 60 weight percent.

19. The method as claimed in claim 15, wherein performing the planarization process comprises thinning down the passivation layer to expose the through-silicon via.

20. The method as claimed in claim 15, wherein etching the trimmed substrate comprises using a fluorine-based etchant gas.

* * * * *